(12) United States Patent
Wu et al.

(10) Patent No.: US 10,854,297 B1
(45) Date of Patent: Dec. 1, 2020

(54) OPERATING METHOD OF A LOW CURRENT ELECTRICALLY ERASABLE PROGRAMMABLE READ ONLY MEMORY (EEPROM) ARRAY

(71) Applicant: YIELD MICROELECTRONICS CORP., Chu-Pei (TW)

(72) Inventors: Cheng-Ying Wu, Chu-Pei (TW);
Cheng-Yu Chung, Chu-Pei (TW);
Wen-Chien Huang, Chu-Pei (TW)

(73) Assignee: Yield Microelectronics Corp., Chu-Pei (TW)

( * ) Notice: Subject to any disclaimer, the term of this patent is extended or adjusted under 35 U.S.C. 154(b) by 0 days.

(21) Appl. No.: 16/739,384

(22) Filed: Jan. 10, 2020

(30) Foreign Application Priority Data

Nov. 13, 2019 (TW) .............................. 108141241 A (51) Int. Cl.
| | |
|---|---|
| *G11C 16/10* | (2006.01) |
| *G11C 16/04* | (2006.01) |
| *H01L 27/11521* | (2017.01) |
| *G11C 16/08* | (2006.01) |
| *G11C 16/14* | (2006.01) |
| *G11C 16/24* | (2006.01) |

(52) U.S. Cl.
CPC .......... *G11C 16/10* (2013.01); *G11C 16/0433* (2013.01); *G11C 16/08* (2013.01); *G11C 16/14* (2013.01); *G11C 16/24* (2013.01); *H01L 27/11521* (2013.01)

(58) Field of Classification Search
None
See application file for complete search history.

(56) References Cited

U.S. PATENT DOCUMENTS

| | | | | |
|---|---|---|---|---|
| 2006/0102967 A1* | 5/2006 | Kamigaki | ............. | H01L 27/115 257/390 |
| 2006/0170028 A1* | 8/2006 | Jeon | ...................... | H01L 27/115 257/314 |
| 2020/0118631 A1* | 4/2020 | Lin | ........................ | G11C 16/10 |

* cited by examiner

*Primary Examiner* — Tan T. Nguyen
(74) *Attorney, Agent, or Firm* — Rosenberg, Klein & Lee (57) ABSTRACT

An operating method of low current electrically erasable programmable read only memory (EEPROM) array is provided. The EEPROM array comprises a plurality of bit line groups, word lines, common source lines, and sub-memory arrays. A first memory cell of each sub-memory array is connected with one bit line of a first bit line group, a first common source line, and a first word line. A second memory cell of each sub-memory array is connected with the other bit line of the first bit line group, the first common source line, and a second word line. The first and second memory cells are symmetrically arranged at two opposite sides of the first common source line. By employing the proposed specific operation and bias conditions of the present invention, rapidly bytes programming and erasing functions with low current, low voltage and low cost goals are accomplished.

14 Claims, 6 Drawing Sheets

OPERATING METHOD OF A LOW CURRENT ELECTRICALLY ERASABLE PROGRAMMABLE READ ONLY MEMORY (EEPROM) ARRAY

This application claims priority for Taiwan patent application no. 108141241 filed on Nov. 13, 2019, the content of which is incorporated by reference in its entirely.

BACKGROUND OF THE INVENTION

Field of the Invention

The present invention is related to a memory array, and more particularly to methods for rapidly programming and erasing of a low current EEPROM (Electrically Erasable Programmable Read Only Memory) array.

Description of the Related Art

The Complementary Metal Oxide Semiconductor (CMOS) technology has been developed as a commonly used process for fabricating Application Specific Integrated Circuits (ASIC). Nowadays, as the computer information products are blooming, flash memories and Electrically Erasable Programmable Memory (EEPROM) have been widely used in electronic products since the data stored within will not volatilize but can be erased and programmed electrically. In addition, the data will not disappear even after the power is turned off.

Figure 1:
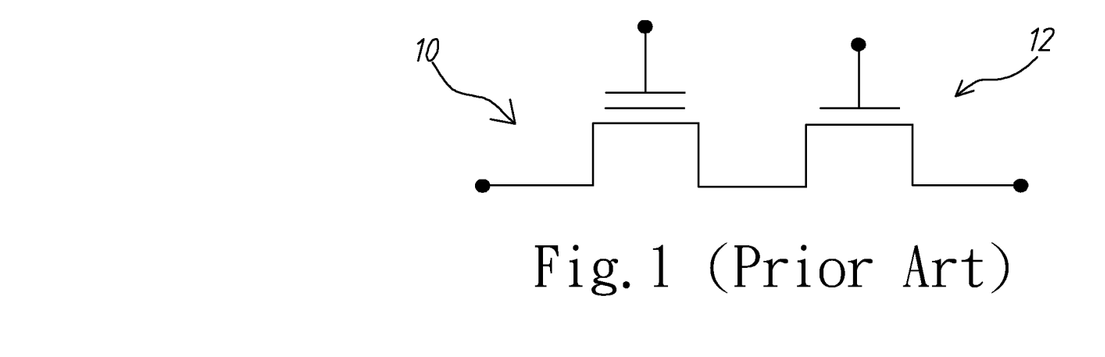
FIG. 1 schematically shows a circuit diagram of a one-bit memory cell of a conventional EEPROM architecture.
Figure 2:
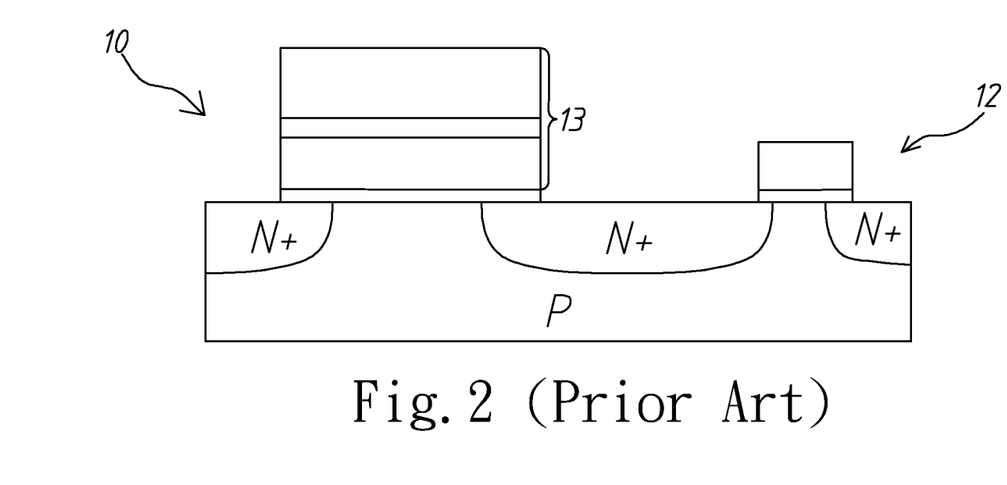
FIG. 2 schematically shows a cross sectional view of a one-bit memory cell of a conventional EEPROM architecture.

Non-volatile memories are programmable, and are able to adjust gate voltages of their transistors by storing charges, or to preserve the original gate voltages of transistors by not storing charges. When regarding to erase a non-volatile memory, the charges stored in the non-volatile memory are removed to resume the initial state of the memory, and return to its original gate voltages of the transistors. The flash memory architecture has advantages of small size and low cost. However, the flash memory architecture does not allow erasing or programming a single one-bit memory cell but only erasing or programming a block of the memory. Owing to this, the flash memory architecture is inconvenient in application. On the contrary, the EEPROM architecture supports a "byte write" function. Thus, compared to the flash memory architecture, the EEPROM architecture provides much more conveniences in application. Please refer to FIG. 1 and FIG. 2 respectively, which shows a circuit diagram and a cross sectional view of a one-bit memory cell of the conventional EEPROM architecture, schematically. As shown in FIG. 1 and FIG. 2, the one-bit memory cell of the EEPROM architecture comprises two transistors: a memory transistor 10 and a selection transistor 12. A capacitor structure 13 is disposed above the memory transistor 10 so as to form a Polycrystalline memory cell. Due to the abovementioned traditional memory cell structure, EEPROM usually occupies larger area than the flash memory. In addition, when perform bit erasing of the EEPROM, for those transistors which are not being selected, isolation must be done. And thus, the cost of using EEPROM would be much more increased.

Therefore, based on the prior arts as discussed above, it should be apparent and obvious that there is indeed an urgent need for the professionals in the field for a novel and inventive modified low-current EEPROM array and its operating method thereof to be developed, which can effectively solve those above mentioned problems occurring in the prior design and perform rapidly bytes programming and erasing functions instead, for reaching the low-current, low-voltage and low-cost goals.

SUMMARY OF THE INVENTION

In order to overcome the above mentioned disadvantages of the prior arts, one major objective in accordance with the present invention is to provide an operating method of a low current electrically erasable programmable read only memory (EEPROM) array, which is characterized by low current, low voltage and low fabrication cost. By employing the proposed specific operation and bias conditions of the present invention, rapidly bytes programming and erasing functions of the EEPROM array are accomplished.

In order to achieve the above mentioned objective, the present invention is aimed to provide an operating method of a low current electrically erasable programmable read only memory array, which is applied to a low current EEPROM array. The low current EEPROM array comprises a plurality of bit lines in parallel, which are divided into a plurality of bit line groups including a first bit line group; a plurality of word lines in parallel, which are vertical to the bit lines and include a first word line and a second word line; a plurality of common source lines in parallel, which are parallel to the word lines and include a first common source line; and a plurality of sub-memory arrays. Each of the sub-memory arrays is connected with a bit line group, a pair of word lines and a common source line. Each sub-memory array comprises a first memory cell and a second memory cell. The first memory cell is connected with the first bit line group, the first common source line and the first word line. The second memory cell is connected with the first bit line group, the first common source line and the second word line. The first memory cell and the second memory cell are symmetrically arranged at two opposite sides of the first common source line. The first bit line group includes two bit lines, which are respectively connected with the first memory cell and the second memory cell.

Each of the first memory cell and the second memory cells serves as an operation memory cell. In selecting one of the operation memory cells as a selected memory cell for carrying out its operations, the operation memory cells, that are connected to the same bit line connecting to the selected memory cell, but not connected to the same common source line connecting to the selected memory cell, are referred to as a plurality of common bit line memory cells; the operation memory cells, that are connected to the same word line connecting to the selected memory cell, are referred to as a plurality of common word memory cells; and the rest of the operation memory cells are referred to a plurality of unselected memory cells.

Each of the first memory cell and the second memory cell may contain an N-type field effect transistor built in a P-type well region or in a P-type substrate. Or, alternatively, each of the first memory cell and the second memory cell may contain a P-type field effect transistor built in an N-type well region or in an N-type substrate.

In the embodiment that the memory cell comprising the N-type field effect transistor, when in operations, performing the following voltage applications as required: applying a substrate voltage $V_{subp}$ respectively on a P-type well region or a P-type substrate connecting to a selected memory cell; applying a first bit voltage $V_{b1}$, a first word voltage $V_{w1}$, and a first common source voltage $V_{s1}$ respectively on a bit line, a word line, and a common source line, all connecting to each selected memory cell; applying second word voltage $V_{w2}$, a second common source voltage $V_{s2}$ respectively on a word line and a common source line connecting to each common bit memory cell; applying a second bit voltage $V_{b2}$, a first common source voltage $V_{s1}$ respectively on a bit line and a common source line connecting to each common word memory cell (each of the common word memory cells sharing a common source line); and applying a second bit voltage $V_{b2}$, a second word voltage $V_{w2}$, and a second common source voltage $V_{s2}$ respectively on the bit line, the word line, and the common source line connecting to each unselected memory cell.

As such, when writing data into the selected memory cell, following conditions are satisfied:

$V_{subp}$ is grounded (0), $V_{b1}$=HV (High Voltage), $V_{s1}$=floating voltage, and $V_{w1}$=HV (High Voltage).

When erasing data from the selected memory cell, following conditions are satisfied:

$V_{subp}$ is grounded (0), $V_{b1}$=HV (High Voltage), $V_{s1}$=floating voltage, and $V_{w1}$=floating voltage.

Regarding writing data and operating the unselected memory cells, following conditions are satisfied:

$V_{subp}$ is grounded (0), $V_{b1}$=HV (High Voltage), $V_{s2}$=0 to MV (Middle Voltage), and $V_{w2}$=0 to MV (Middle Voltage); or $V_{subp}$ is grounded (0), $V_{b2}$=floating voltage, $V_{s2}$=0 to MV (Middle Voltage), and $V_{w2}$=0 to MV (Middle Voltage); or $V_{subp}$ is grounded (0), $V_{b2}$=floating voltage, $V_{s1}$=floating voltage, and $V_{w1}$=HV (High Voltage); and regarding erasing data and operating the unselected memory cells, following conditions are satisfied:

$V_{subp}$ is grounded (0), $V_{b1}$=HV (High Voltage), $V_{s2}$=0 to MV (Middle Voltage), and $V_{w2}$=0 to MV (Middle Voltage); or $V_{subp}$ is grounded (0), $V_{b2}$=floating voltage, $V_{s2}$=0 to MV (Middle Voltage), and $V_{w2}$=0 to MV (Middle Voltage); or $V_{subp}$ is grounded (0), $V_{b2}$=floating voltage, $V_{s1}$=floating voltage, and $V_{w1}$=floating voltage.

In another aspect, in the embodiment that the memory cell, comprising the P-type field effect transistor, when in operations, a substrate voltage $V_{subn}$ on an N-type well region or an N-type substrate connecting to a selected memory cell is applied. And the following voltage applications are as required:

when writing data into the selected memory cell, following conditions are satisfied:

$V_{subn}$ is HV (High Voltage), $V_{b1}$=grounded (0), $V_{s1}$=floating voltage, and $V_{w1}$=grounded (0);

when erasing data from the selected memory cell, following conditions are satisfied:

$V_{subn}$ is HV (High Voltage), $V_{b1}$=grounded (0), $V_{s1}$=floating voltage, and $V_{w1}$=floating voltage.

Regarding writing data and operating the unselected memory cells, following conditions are satisfied:

$V_{subn}$ is HV (High Voltage), $V_{b1}$=grounded (0), $V_{s2}$=HV (High Voltage) to MV (Middle Voltage), and $V_{w2}$=HV (High Voltage) to MV (Middle Voltage); or $V_{subn}$ is HV (High Voltage), $V_{b2}$=floating voltage, $V_{s2}$=HV (High Voltage) to MV (Middle Voltage), and $V_{w2}$=HV (High Voltage) to MV (Middle Voltage); or $V_{subn}$ is HV (High Voltage), $V_{b2}$=floating voltage, $V_{s1}$=floating voltage, and $V_{w1}$=grounded (0); and regarding erasing data and operating the unselected memory cells, following conditions are satisfied:

$V_{subn}$ is HV (High Voltage), $V_{b1}$=grounded (0), $V_{s2}$=HV (High Voltage) to MV (Middle Voltage), and $V_{w2}$=HV (High Voltage) to MV (Middle Voltage); or $V_{subn}$ is HV (High Voltage), $V_{b2}$=floating voltage, $V_{s2}$=HV (High Voltage) to MV (Middle Voltage), and $V_{w2}$=HV (High Voltage) to MV (Middle Voltage); or $V_{subn}$ is HV (High Voltage), $V_{b2}$=floating voltage, $V_{s1}$=floating voltage, and $V_{w1}$=floating voltage.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

Figure 3:
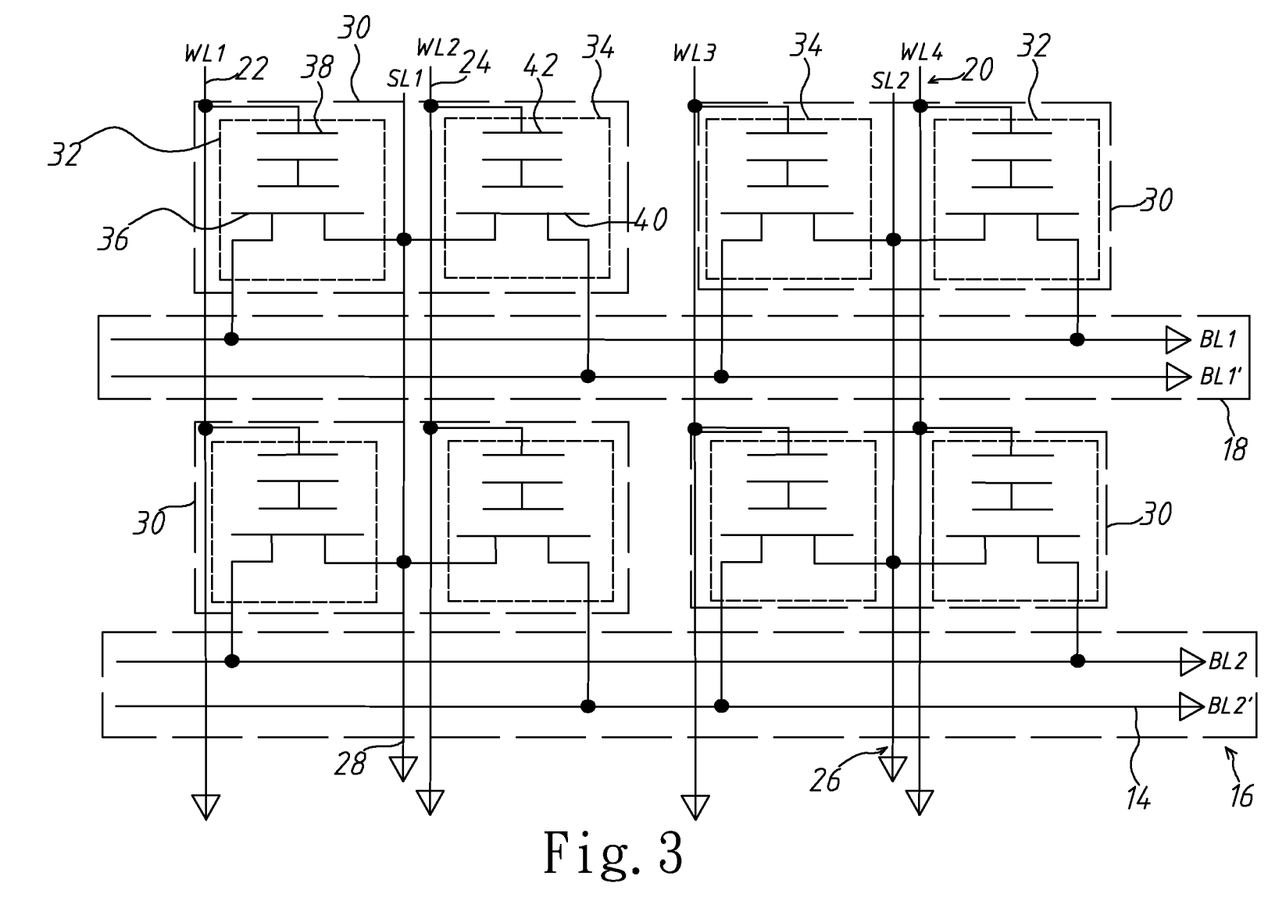
FIG. 3 schematically shows a circuit diagram of a low current EEPROM array in accordance with an embodiment of the present invention.

In the following, please refer to FIG. 3 and FIG. 4 at the same time for a low current EEPROM (Electrically Erasable Programmable Read Only Memory) array in accordance with the embodiment of the present invention. The low current EEPROM array comprises a plurality of bit lines 14 in parallel, and the bit lines 14 are divided into a plurality of bit line groups 16, including a first bit line group 18, wherein the first bit line group 18 comprises two bit lines 14. A plurality of word lines 20 in parallel are vertical to the bit lines 14 and include a first word line 22 and a second word line 24. A plurality of common source lines 26 in parallel are parallel to the word lines 20 and include a first common source line 28. The bit lines 14, the word lines 20 and the common source lines 26 are connected with a plurality of sub-memory array 30 each containing 2×1 pieces of memory cells. Each sub-memory array 30 is connected with one bit line group 16, two word lines 20 and one common source line 26. Since the connections of each of the sub-memory arrays 30 with the bit line group 16, the word lines 20 and the common source line 26 are similar, the present application merely describes the common characteristics of the connections as the following.

Figure 4:
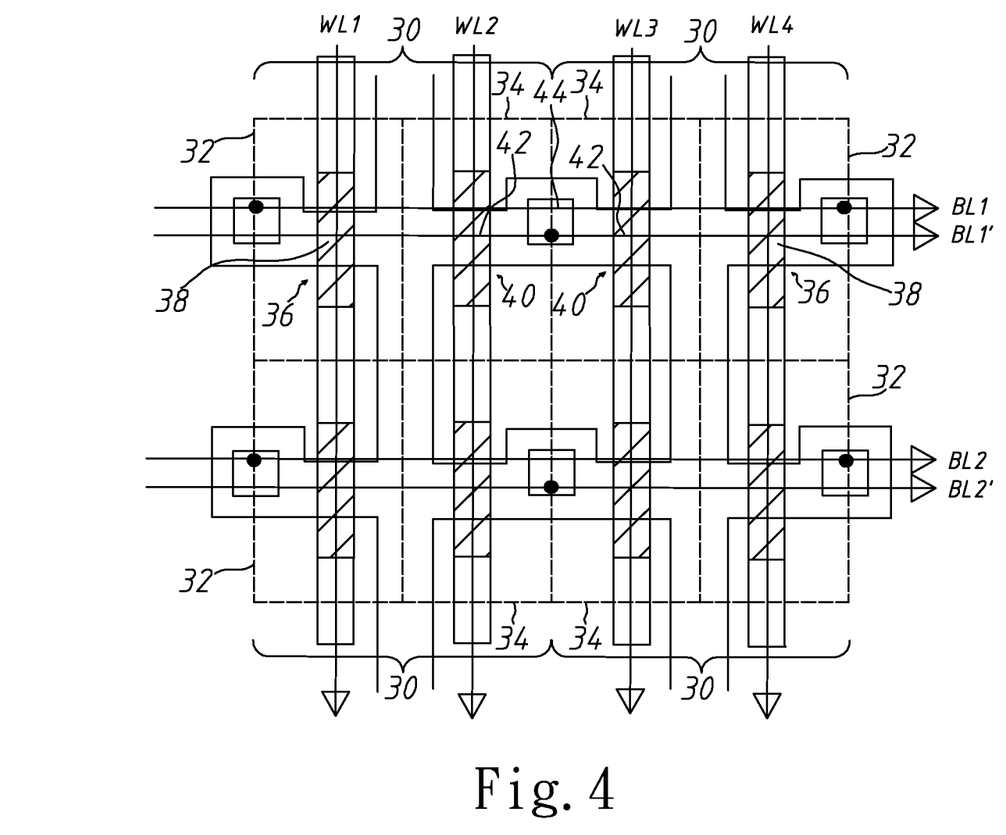
FIG. 4 schematically shows a layout of the circuit diagram of a low current EEPROM array in accordance with the embodiment of the present invention.
Figure 5:
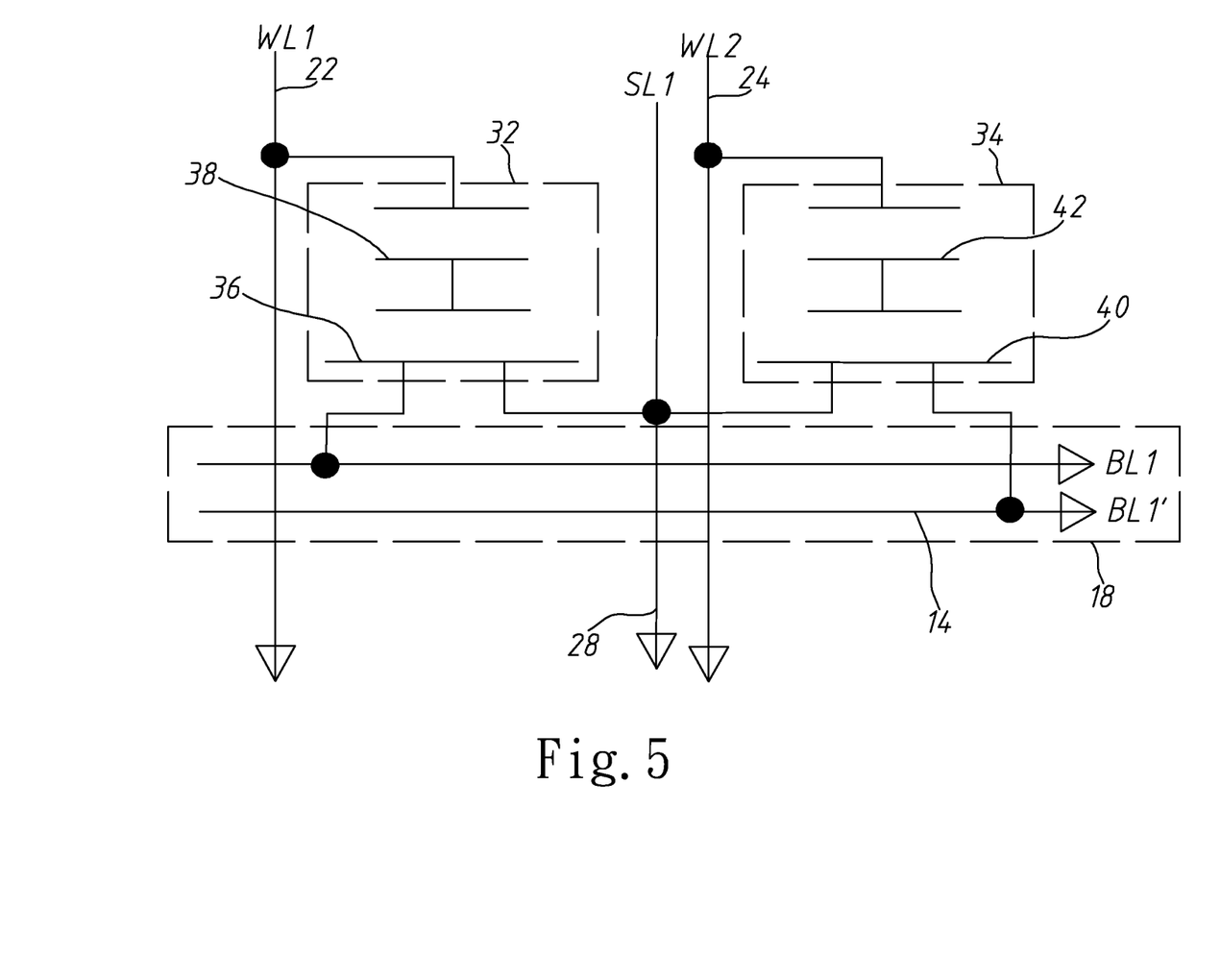
FIG. 5 schematically shows a circuit diagram of a sub-memory array of a low current EEPROM array in accordance with the embodiment of the present invention.

Please refer to FIG. 4 and FIG. 5. Each sub-memory array 30 comprises a first memory cell 32 and a second memory cell 34. The first memory cell 32 is connected with one bit line 14 of the first bit line group 18, the first common source line 28 and the first word line 22. The second memory cell 34 is connected with the other bit line 14 of the first bit line group 18, the first common source line 28 and the second word line 24. The first memory cell 32 and the second memory cell 34 are symmetrically arranged at two opposite sides of the first common source line 28. In the embodiment, two second memory cells 34 of two adjacent sub-memory arrays 30 are neighboring and share a common bit line 14 and a common contact. In other words, the FETs 40 of two second memory cells 34 are neighboring and share a common bit line 14 and a common drain contact 44. As a result, the area of the overall layout is believed to be reduced.

The first memory cell 32 further comprises a Field Effect Transistor (FET) 36 and a capacitor 38. The FET 36 has a floating gate and a drain of the FET 36 is connected with the bit line 14 of the first bit line group 18. A source of the FET 36 is connected with the first common source line 28. One terminal of the capacitor 38 is connected with the floating gate of the FET 36, and the other terminal of the capacitor 38 is connected with the first word line 22 to receive a bias from the first word line 22. The FET 36 also receives a bias from the bit line 14 of the first bit line group 18 and a bias from the first common source line 28 so as to write data into or erase data from the floating gate of the FET 36.

The second memory cell 34 further comprises an FET 40 and a capacitor 42. The FET 40 has a floating gate, and a drain of the FET 40 is connected with the bit line 14 of the first bit line group 18. A source of the FET 40 is connected with the first common source line 28. One terminal of the capacitor 42 is connected with the floating gate of the FET 40, and the other terminal of the capacitor 42 is connected with the second word line 24 to receive a bias from the second word line 24. The FET 40 also receives a bias from the bit line 14 of the first bit line group 18 and receives a bias from the first common source line 28 so as to write data into or erase data from the floating gate of the FET 40. In addition, in two adjacent sub-memory arrays 30, the FETs 40 of two second memory cells 34 are neighboring and share a common bit line 14 and a common drain contact 44, whereby the area of the overall layout of the circuit is reduced.

Next, please refer to FIG. 3 again. Both the FET 36 and the FET 40 can be N-type FETs built in a P-type substrate or a P-type well region. Alternatively, both the FET 36 and the FET 40 can also be P-type FETs built in an N-type substrate or an N-type well region. The operating method of the low current EEPROM array may comprise a variety of sub-embodiments with respect to the different type of the FETs. In the following descriptions, the sub-embodiment which corresponds to the N-type FETs 36 and 40 will be introduced first. In order to fully describe the operating method in details, we have to clearly define the terms of the various memory cells first as follows.

Both the abovementioned first and second memory cells 32 and 34 are operation memory cells, and one of the operation memory cells can be chosen as the selected memory cell to proceed with the operations as required. As to the operation memory cells, that are connected to the same bit line 14 connecting to the selected memory cell, but not connected to the same common source line 26 connecting to the selected memory cell, are referred to as a plurality of common bit memory cells; the operation memory cells, that are connected to the same word line 20 connecting to the selected memory cell, are referred to as a plurality of common word memory cells; and the rest of the operation memory cells are referred to as a plurality of unselected memory cells.

In the following, the operations of the embodiment are described, so that in such operating method, those unselected memory cells will not be affected, thus the operating method is only applied to one single specific memory cell.

When in operations, performing the following voltage applications as required:

applying a substrate voltage $V_{subp}$ on a P-type well region or P-type substrate connecting to a selected memory cell;

applying a first bit voltage $V_{b1}$, a first word voltage $V_{w1}$, and a first common source voltage $V_{s1}$ respectively on a bit line 14, a word line 20, and a common source line 26, all connecting to the selected memory cell;

applying a second word voltage $V_{w2}$, a second common source voltage $V_{s2}$ respectively on a word line 20 and a common source line 26, both connecting to each common bit memory cell;

applying a second bit voltage $V_{b2}$, a first common source voltage $V_{s1}$ respectively on a bit line 14, and a common source line 26, both connecting to each common word memory cell (each of the common word memory cells sharing a common source line); and applying a second bit voltage $V_{b2}$, a second word voltage $V_{w2}$, and a second common source voltage $V_{s2}$ respectively on the bit line 14, the word line 20, and the common source line 26, all connecting to an unselected memory cell.

When writing data into the selected memory cell, the following condition has to be satisfied:

$V_{subp}$ is grounded (0), $V_{b1}$=HV (High Voltage), $V_{s1}$=floating voltage, and $V_{w1}$=HV (High Voltage).

When erasing data from the selected memory cell, the following condition has to be satisfied:

$V_{subp}$ is grounded (0), $V_{b1}$=HV (High Voltage), $V_{s1}$=floating voltage, and $V_{w1}$=floating voltage.

Regarding writing data and operating the unselected memory cells, the following conditions have to be satisfied:

$V_{subp}$ is grounded (0), $V_{b1}$=HV (High Voltage), $V_{s2}$=0 to MV (Middle Voltage), and $V_{w2}$=0 to MV (Middle Voltage); or $V_{subp}$ is grounded (0), $V_{b2}$=floating voltage, $V_{s2}$=0 to MV (Middle Voltage), and $V_{w2}$=0 to MV (Middle Voltage); or $V_{subp}$ is grounded (0), $V_{b2}$=floating voltage, $V_{s1}$=floating voltage, and $V_{w1}$=HV (High Voltage).

Regarding erasing data and operating the unselected memory cells, the following conditions have to be satisfied:

$V_{subp}$ is grounded (0), $V_{b1}$=HV (High Voltage), $V_{s2}$=0 to MV (Middle Voltage), and $V_{w2}$=0 to MV (Middle Voltage); or $V_{subp}$ is grounded (0), $V_{b2}$=floating voltage, $V_{s2}$=0 to MV (Middle Voltage), and $V_{w2}$=0 to MV (Middle Voltage); or $V_{subp}$ is grounded (0), $V_{b2}$=floating voltage, $V_{s1}$=floating voltage, and $V_{w1}$=floating voltage.

On the contrary, while the FET 36 and the FET 40 are P-type FETs, according to the above mentioned definitions of the memory cells and voltages, apply a substrate voltage $V_{subn}$ on an N-type well region or an N-type substrate connecting to a selected memory cell, and satisfy the following conditions.

When writing data into the selected memory cell, the following condition has to be satisfied:

$V_{subn}$ is HV (High Voltage), $V_{b1}$=grounded (0), $V_{s1}$=floating voltage, and $V_{w1}$=grounded (0).

When erasing data from the selected memory cell, the following condition has to be satisfied:

$V_{subn}$ is HV (High Voltage), $V_{b1}$=grounded (0), $V_{s1}$=floating voltage, and $V_{w1}$=floating voltage.

Regarding writing data and operating the unselected memory cells, the following conditions have to be satisfied:

$V_{subn}$ is HV (High Voltage), $V_{b1}$=grounded (0), $V_{s2}$=HV (High Voltage) to MV (Middle Voltage), and $V_{w2}$=HV (High Voltage) to MV (Middle Voltage); or $V_{subn}$ is HV (High Voltage), $V_{b2}$=floating voltage, $V_{s2}$=HV (High Voltage) to MV (Middle Voltage), and $V_{w2}$=HV (High Voltage) to MV (Middle Voltage); or $V_{subn}$ is HV (High Voltage), $V_{b2}$=floating voltage, $V_{s1}$=floating voltage, and $V_{w1}$=grounded (0).

Regarding erasing data and operating the unselected memory cells, the following conditions have to be satisfied:

$V_{subn}$ is HV (High Voltage), $V_{b1}$=grounded (0), $V_{s2}$=HV (High Voltage) to MV (Middle Voltage), and $V_{w2}$=HV (High Voltage) to MV (Middle Voltage); or $V_{subn}$ is HV (High Voltage), $V_{b2}$=floating voltage, $V_{s2}$=HV (High Voltage) to MV (Middle Voltage), and $V_{w2}$=HV (High Voltage) to MV (Middle Voltage); or $V_{subn}$ is HV (High Voltage), $V_{b2}$=floating voltage, $V_{s1}$=floating voltage, and $V_{w1}$=floating voltage.

Since two memory cells 32 and 34 in a sub-memory array 30 are connected respectively to two bit lines 14, the first word line 22 and the second word line 24 in the same sub-memory array 30 can be connected to the same voltage, without affecting the byte write and byte erase functions of the EEPROM of the present invention. In other words, it may be connected through the same connection line for output, hereby reducing the area for the decoding region.

Figure 6:
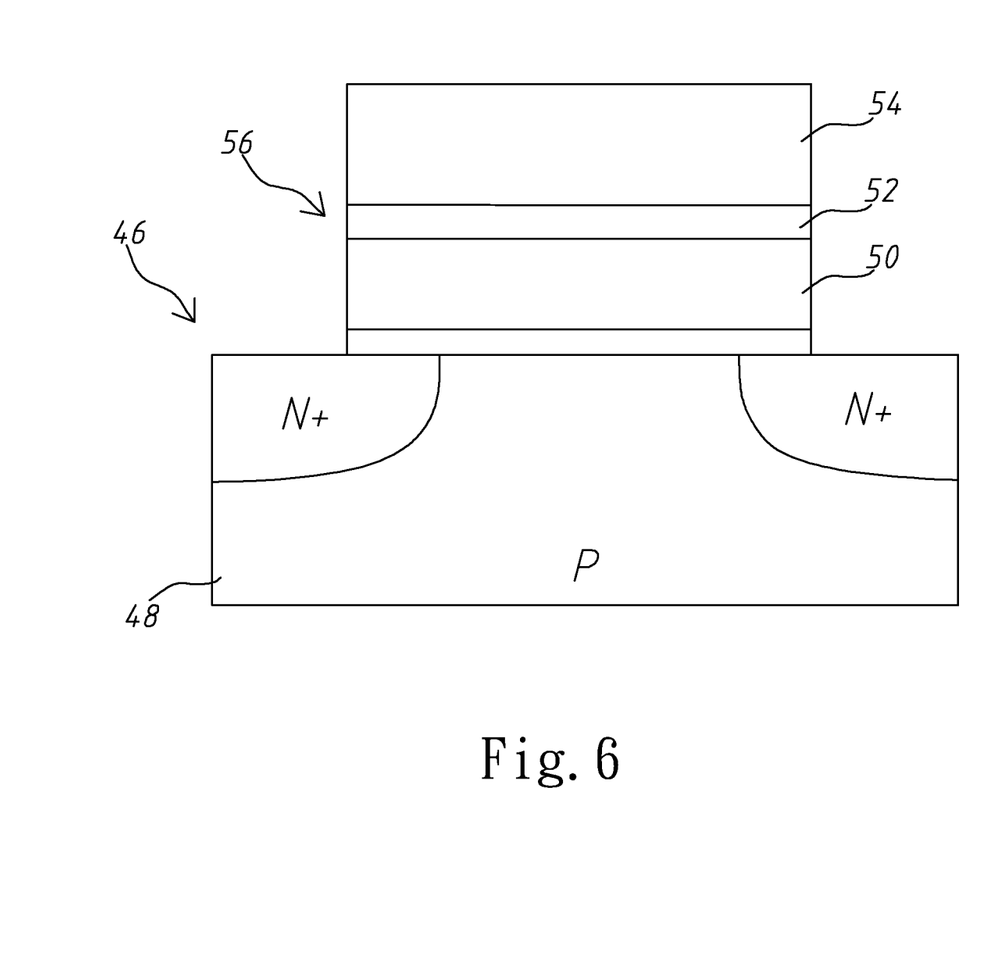
FIG. 6 schematically shows a cross sectional view of an N-type FET and a capacitor of a memory cell according to a first embodiment of the present invention.

In the following, a cross sectional view of a structure of field effect transistors 36 and 40 and capacitors 38 and 42 of the present invention is described. In such embodiment, an N-type field effect transistor is taken as an example for explanation. Please refer to FIG. 6, in which an N-type field effect transistor 46 is disposed in a P-type semiconductor substrate 48, and is provided with a floating gate 50. On the floating gate 50 is provided sequentially with an oxide layer 52 and a control gate 54, such that the control gate 54, the oxide layer 52, and the floating gate 50 form a capacitor 56, and the floating gate 50 and the control gate 54 are made of polysilicon. In such embodiment that a P-type semiconductor substrate is utilized, then a P-type well region may be further provided in the substrate, such that the N-type field effect transistor 46 is disposed in the P-type well region. In such a structure design of memory cell, namely, the structure of Flash memory, the area and cost required for the nonvolatile memory array can be reduced significantly.

Figure 7:
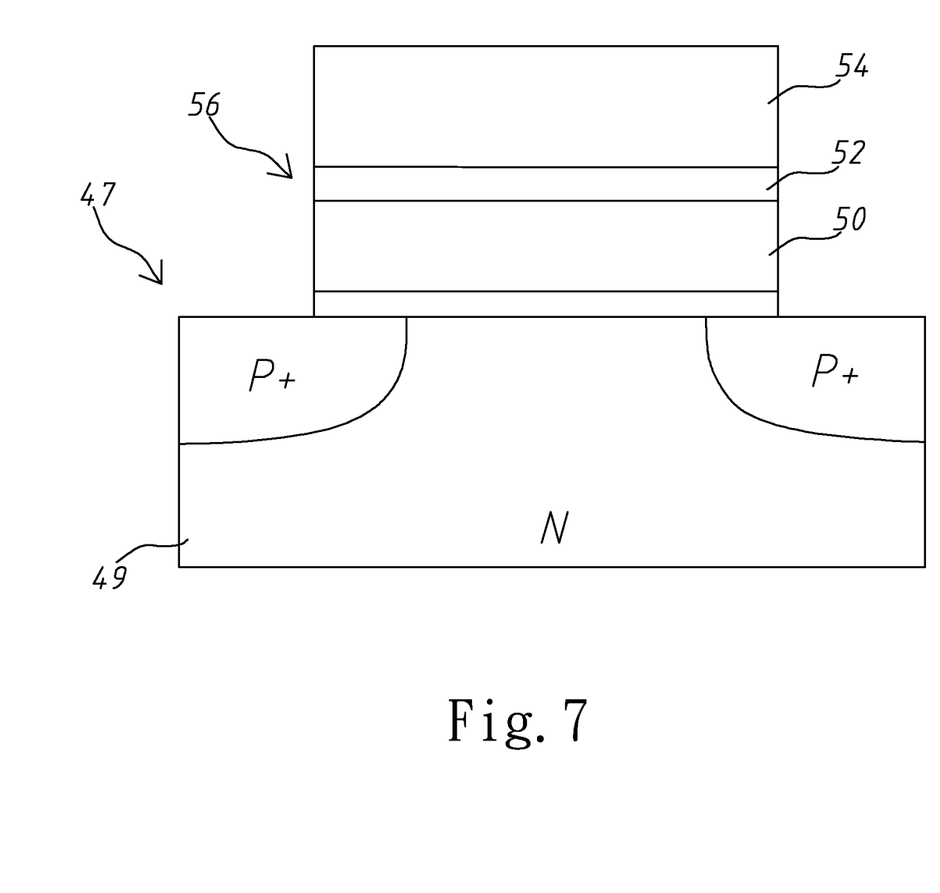
FIG. 7 schematically shows a cross sectional view of a P-type FET and a capacitor of a memory cell according to a second embodiment of the present invention.

Similarly, in the following, a cross sectional view of a structure of field effect transistors 36 and 40 and capacitors 38 and 42 of the present invention is described. In such embodiment, a P-type field effect transistor is taken as a second example for explanation. As shown in FIG. 7, a P-type field effect transistor 47 is disposed in an N-type semiconductor substrate 49, and is provided with a floating gate 50. On the floating gate 50 is provided sequentially with an oxide layer 52 and a control gate 54, such that the control gate 54, the oxide layer 52, and the floating gate 50 form a capacitor 56, and the floating gate 50 and the control gate 54 are made of polysilicon. In such embodiment that an N-type semiconductor substrate is utilized, then an N-type well region can be further provided in the substrate, such that the P-type field effect transistor 47 is disposed in an N-type well region.

To sum up the above, the method for rapidly programming and erasing of a low current EEPROM array according to the present invention is aimed to accomplish the objectives of low current, low voltages and low cost. For such Flash memory architecture characterized by smaller area and lower fabrication cost, the present invention indeed proposes the effective operating methods for writing data into and erasing data from the memory cell thereof, such that the byte program and byte erase functions are achieved and are believed to be much simpler and faster when compared to the prior arts.

Therefore, to sum up, it is believed that the present invention is instinct, effective and highly competitive for recent technology and industries in the market nowadays, whereby having extraordinary availability and competitiveness for future industrial developments and being in condition for early allowance.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. An operating method of a low current electrically erasable programmable read only memory array, wherein said low current electrically erasable programmable read only memory (EEPROM) array comprises: a plurality of bit lines in parallel, which are divided into a plurality of bit line groups including a first bit line group; a plurality of word lines in parallel, which are vertical to said bit lines and include a first word line and a second word line; a plurality of common source lines in parallel, which are parallel to said word lines and include a first common source line; and a plurality of sub-memory arrays, wherein each of said sub-memory arrays is connected with one of said bit line groups, two of said word lines and one of said common source lines, and each of said sub-memory arrays comprises a first memory cell and a second memory cell, wherein said first memory cell is connected with said first bit line group, said first common source line and said first word line, and said second memory cell is connected with said first bit line group, said first common source line and said second word line, said first memory cell and said second memory cell are symmetrically arranged at two opposite sides of said first common source line, and said first bit line group includes two of said bit lines, which are respectively connected with said first memory cell and said second memory cell, and wherein each of said first memory cell and said second memory cell has an N-type field-effect transistor (FET) built in a P-type substrate or a P-type well region, and wherein said first memory cell and said second memory cell are both operation memory cells, in selecting one of said operation memory cells as a selected memory cell for operations, said operation memory cells, that are connected to said same bit line connecting to said selected memory cell, but not connected to said same common source line connecting to said selected memory cell, are referred to as a plurality of common bit memory cells; and said operation memory cells, that are connected to said same word line connecting to said selected memory cell, are referred to as a plurality of common word memory cells; and rest of said operation memory cells are referred to a plurality of unselected memory cells, said operating method comprising:

applying a substrate voltage $V_{subp}$ on said P-type substrate or said P-type well region connecting to said selected memory cell;

applying a first bit voltage $V_{b1}$, a first word voltage $V_{w1}$, and a first common source voltage $V_{s1}$ respectively on said bit line, said word line, and said common source line, all connecting to said selected memory cell;

applying a second word voltage $V_{w2}$, a second common source voltage $V_{s2}$ respectively on said word line and said common source line, both connecting to each said common bit memory cell;

applying a second bit voltage $V_{b2}$, said first common source voltage $V_{s1}$ respectively on said bit line and said common source line, both connecting to each said common word memory cell; and applying said second bit voltage $V_{b2}$, said second word voltage $V_{w2}$, and said second common source voltage $V_{s2}$ respectively on said bit line, said word line, and said common source line, all connecting to each said unselected memory cell;

wherein when writing data into said selected memory cell, following conditions are satisfied:

$V_{subp}$ is grounded (0), $V_{b1}$=HV (High Voltage), $V_{s1}$=floating voltage, and $V_{w1}$=HV (High Voltage);

when erasing data from said selected memory cell, following conditions are satisfied:

$V_{subp}$ is grounded (0), $V_{b1}$=HV (High Voltage), $V_{s1}$=floating voltage, and $V_{w1}$=floating voltage;

regarding writing data and operating said unselected memory cells, following conditions are satisfied:

$V_{subp}$ is grounded (0), $V_{b1}$=HV (High Voltage), $V_{s2}$=0 to MV (Middle Voltage), and $V_{w2}$=0 to MV (Middle Voltage); or $V_{subp}$ is grounded (0), $V_{b2}$=floating voltage, $V_{s2}$=0 to MV (Middle Voltage), and $V_{w2}$=0 to MV (Middle Voltage); or $V_{subp}$ is grounded (0), $V_{b2}$=floating voltage, $V_{s1}$=floating voltage, and $V_{w1}$=HV (High Voltage); and regarding erasing data and operating said unselected memory cells, following conditions are satisfied:

$V_{subp}$ is grounded (0), $V_{b1}$=HV (High Voltage), $V_{s2}$=0 to MV (Middle Voltage), and $V_{w2}$=0 to MV (Middle Voltage); or $V_{subp}$ is grounded (0), $V_{b2}$=floating voltage, $V_{s2}$=0 to MV (Middle Voltage), and $V_{w2}$=0 to MV (Middle Voltage); or $V_{subp}$ is grounded (0), $V_{b2}$=floating voltage, $V_{s1}$=floating voltage, and $V_{w1}$=floating voltage.

2. The operating method of said low current electrically erasable programmable read only memory array according to claim 1, wherein said first word line and said second word line in said same sub-memory array are connected with said same word voltage.

3. The operating method of said low current electrically erasable programmable read only memory array according to claim 1, wherein said two second memory cells of said two adjacent sub-memory arrays are neighboring and share said same bit line and a common contact.

4. The operating method of said low current electrically erasable programmable read only memory array according to claim 1, wherein said N-type FET of said first memory cell has a floating gate, a drain connected with said first bit line group, and a source connected with said first common source, and wherein said first memory cell further comprises a capacitor, one terminal of said capacitor is connected with said floating gate, and another terminal of said capacitor is connected with said first word line to receive a bias from said first word line, and wherein said N-type FET receives a bias from said first bit line group and a bias from said first common source line so as to write data into or erase data from said floating gate of said N-type FET.

5. The operating method of said low current electrically erasable programmable read only memory array according to claim 4, wherein an oxide layer and a control gate are formed above said floating gate in sequence, said control gate, said oxide layer and said floating gate jointly form said capacitor, and said floating gate and said control gate are made of polysilicon.

6. The operating method of said low current electrically erasable programmable read only memory array according to claim 1, wherein said N-type FET of said second memory cell has a floating gate, a drain connected with said first bit line group, and a source connected with said first common source, and wherein said second memory cell further comprises a capacitor, one terminal of said capacitor is connected with said floating gate, and another terminal of said capacitor is connected with said second word line to receive a bias from said second word line, and wherein said N-type FET receives a bias from said first bit line group and a bias from said first common source line so as to write data into or erase data from said floating gate of said N-type FET.

7. The operating method of said low current electrically erasable programmable read only memory array according to claim 6, wherein an oxide layer and a control gate are formed above said floating gate in sequence, said control gate, said oxide layer and said floating gate jointly form said capacitor, and said floating gate and said control gate are made of polysilicon.

8. An operating method of a low current electrically erasable programmable read only memory array, wherein said low current electrically erasable programmable read only memory (EEPROM) array comprises: a plurality of bit lines in parallel, which are divided into a plurality of bit line groups including a first bit line group; a plurality of word lines in parallel, which are vertical to said bit lines and include a first word line and a second word line; a plurality of common source lines in parallel, which are parallel to said word lines and include a first common source line; and a plurality of sub-memory arrays, wherein each of said sub-memory arrays is connected with one of said bit line groups, two of said word lines and one of said common source lines, and each of said sub-memory arrays comprises a first memory cell and a second memory cell, wherein said first memory cell is connected with said first bit line group, said first common source line and said first word line, and said second memory cell is connected with said first bit line group, said first common source line and said second word line, said first memory cell and said second memory cell are symmetrically arranged at two opposite sides of said first common source line, and said first bit line group includes two of said bit lines, which are respectively connected with said first memory cell and said second memory cell, and wherein each of said first memory cell and said second memory cell has an P-type field-effect transistor (FET) built in a N-type substrate or a N-type well region, and wherein said first memory cell and said second memory cell are both operation memory cells, in selecting one of said operation memory cells as a selected memory cell for operations, said operation memory cells, that are connected to said same bit line connecting to said selected memory cell, but not connected to said same common source line connecting to said selected memory cell, are referred to as a plurality of common bit memory cells; and said operation memory cells, that are connected to said same word line connecting to said selected memory cell, are referred to as a plurality of common word memory cells; and rest of said operation memory cells are referred to a plurality of unselected memory cells, said operating method comprising:

applying a substrate voltage $V_{subn}$ on said N-type substrate or said N-type well region connecting to said selected memory cell;

applying a first bit voltage $V_{b1}$, a first word voltage $V_{w1}$, and a first common source voltage $V_{s1}$ respectively on said bit line, said word line, and said common source line, all connecting to said selected memory cell;

applying a second word voltage $V_{w2}$, a second common source voltage $V_{s2}$ respectively on said word line and said common source line, both connecting to each said common bit memory cell;

applying a second bit voltage $V_{b2}$, said first common source voltage $V_{s1}$ respectively on said bit line and said common source line, both connecting to each said common word memory cell; and applying said second bit voltage $V_{b2}$, said second word voltage $V_{w2}$, and said second common source voltage $V_{s2}$ respectively on said bit line, said word line, and said common source line, all connecting to each said unselected memory cell;

wherein when writing data into said selected memory cell, following conditions are satisfied:

$V_{subn}$ is HV (High Voltage), $V_{b1}$=grounded (0), $V_{s1}$=floating voltage, and $V_{w1}$=grounded (0);

when erasing data from said selected memory cell, following conditions are satisfied:

$V_{subn}$ is HV (High Voltage), $V_{b1}$=grounded (0), $V_{s1}$=floating voltage, and $V_{w1}$=floating voltage;

regarding writing data and operating said unselected memory cells, following conditions are satisfied:

$V_{subn}$ is HV (High Voltage), $V_{b1}$=grounded (0), $V_{s2}$=HV (High Voltage) to MV (Middle Voltage), and $V_{w2}$=HV (High Voltage) to MV (Middle Voltage); or $V_{subn}$ is HV (High Voltage), $V_{b2}$=floating voltage, $V_{s2}$=HV (High Voltage) to MV (Middle Voltage), and $V_{w2}$=HV (High Voltage) to MV (Middle Voltage); or $V_{subn}$ is HV (High Voltage), $V_{b2}$=floating voltage, $V_{s1}$=floating voltage, and $V_{w1}$=grounded (0); and regarding erasing data and operating said unselected memory cells, following conditions are satisfied:

$V_{subn}$ is HV (High Voltage), $V_{b1}$=grounded (0), $V_{s2}$=HV (High Voltage) to MV (Middle Voltage), and $V_{w2}$=HV (High Voltage) to MV (Middle Voltage); or $V_{subn}$ is HV (High Voltage), $V_{b2}$=floating voltage, $V_{s2}$=HV (High Voltage) to MV (Middle Voltage), and $V_{w2}$=HV (High Voltage) to MV (Middle Voltage); or $V_{subn}$ is HV (High Voltage), $V_{b2}$=floating voltage, $V_{s1}$=floating voltage, and $V_{w1}$=floating voltage.

9. The operating method of said low current electrically erasable programmable read only memory array according to claim 8, wherein said first word line and said second word line in said same sub-memory array are connected with said same word voltage.

10. The operating method of said low current electrically erasable programmable read only memory array according to claim 8, wherein said two second memory cells of said two adjacent sub-memory arrays are neighboring and share said same bit line and a common contact.

11. The operating method of said low current electrically erasable programmable read only memory array according to claim 8, wherein said P-type FET of said first memory cell has a floating gate, a drain connected with said first bit line group, and a source connected with said first common source, and wherein said first memory cell further comprises a capacitor, one terminal of said capacitor is connected with said floating gate, and another terminal of said capacitor is connected with said first word line to receive a bias from said first word line, and wherein said P-type FET receives a bias from said first bit line group and a bias from said first common source line so as to write data into or erase data from said floating gate of said P-type FET.

12. The operating method of said low current electrically erasable programmable read only memory array according to claim 11, wherein an oxide layer and a control gate are formed above said floating gate in sequence, said control gate, said oxide layer and said floating gate jointly form said capacitor, and said floating gate and said control gate are made of polysilicon.

13. The operating method of said low current electrically erasable programmable read only memory array according to claim 8, wherein said P-type FET of said second memory cell has a floating gate, a drain connected with said first bit line group, and a source connected with said first common source, and wherein said second memory cell further comprises a capacitor, one terminal of said capacitor is connected with said floating gate, and another terminal of said capacitor is connected with said second word line to receive a bias from said second word line, and wherein said P-type FET receives a bias from said first bit line group and a bias from said first common source line so as to write data into or erase data from said floating gate of said P-type FET.

14. The operating method of said low current electrically erasable programmable read only memory array according to claim 13, wherein an oxide layer and a control gate are formed above said floating gate in sequence, said control gate, said oxide layer and said floating gate jointly form said capacitor, and said floating gate and said control gate are made of polysilicon.

* * * * *